United States Patent
Huang et al.

(10) Patent No.: US 10,827,660 B2
(45) Date of Patent: Nov. 3, 2020

(54) CONDUCTIVE COMPOSITION FOR LOW FREQUENCY EMI SHIELDING

(71) Applicants: Henkel IP & Holding GmbH, Duesseldorf (DE); Henkel AG & Co. KGaA, Duesseldorf (DE)

(72) Inventors: Chenyu Huang, Shanghai (CN); Lily Yan, Shanghai (CN); Qili Wu, Shanghai (CN); Xiping He, Cerritos, CA (US); Li Yao, Irvine, CA (US)

(73) Assignees: Henkel IP & Holding GmbH, Duesseldorf (DE); Henkel AG & Co. KGaA, Duesseldorf (DE)

( * ) Notice: Subject to any disclaimer, the term of this patent is extended or adjusted under 35 U.S.C. 154(b) by 0 days.

(21) Appl. No.: 15/964,665

(22) Filed: Apr. 27, 2018

(65) Prior Publication Data

US 2018/0249603 A1    Aug. 30, 2018

Related U.S. Application Data

(63) Continuation of application No. PCT/CN2015/092954, filed on Oct. 27, 2015.

(51) Int. Cl.
*H01B 1/22*    (2006.01)
*H05K 9/00*    (2006.01)
*H01L 23/552*    (2006.01)

(52) U.S. Cl.
CPC ............. *H05K 9/0083* (2013.01); *H01B 1/22* (2013.01); *H01L 23/552* (2013.01); *H05K 9/0088* (2013.01)

(58) Field of Classification Search
CPC ..... H01L 23/552; H01L 23/66; H05K 9/0083; H05K 9/0088; C09K 3/00; H01B 1/22
See application file for complete search history.

(56) References Cited

U.S. PATENT DOCUMENTS 4,783,279 A * 11/1988 Petermann ............... H01B 1/22
                                                        252/503
5,498,644 A *  3/1996 Reo ............................ C08J 9/32
                                                        252/511

(Continued)

FOREIGN PATENT DOCUMENTS

CN          1887038        12/2006
CN        101451057         6/2009

(Continued)

*Primary Examiner* — Mark Kopec
*Assistant Examiner* — Jaison P Thomas
(74) *Attorney, Agent, or Firm* — Steven C. Bauman (57) ABSTRACT

The present invention relates to a conductive compositions for low frequency EMI shielding. An EMI shielding composition according to the present invention comprises a resin comprising a thermoplastic resin and/or a thermoset resin, a solvent and/or a reactive diluent and particles, wherein said particles comprise a mixture of magnetic particles and electrically conductive particles or magnetic particles coated with electrically conductive material or a mixture of magnetic particles coated with electrically conductive material and electrically conductive particles and wherein, said composition comprises ≥10% magnetic particles by weight, by total weight of the composition. The EMI shielding composition according to the present invention has good electrical and magnetic conductivity and is suitable as a drop-in solution for EMI shielding in a wide frequency range, and especially at low frequency ranges.

18 Claims, 2 Drawing Sheets

(56) References Cited

U.S. PATENT DOCUMENTS

| | | | | |
|---|---|---|---|---|
| 6,379,589 | B1 * | 4/2002 | Aldissi | B22F 1/025 |
| | | | | 252/500 |
| 2005/0079353 | A1 * | 4/2005 | Harper | C08K 9/02 |
| | | | | 428/407 |
| 2012/0037399 | A1 | 2/2012 | Hsiao et al. | |
| 2013/0236655 | A1 * | 9/2013 | Nasu | H05K 9/0092 |
| | | | | 427/511 |
| 2018/0163063 | A1 * | 6/2018 | Gao | C09D 163/00 |
| 2018/0206367 | A1 * | 7/2018 | Oh | H01B 1/023 |
| 2018/0376628 | A1 * | 12/2018 | Ghosh | H01B 1/24 |

FOREIGN PATENT DOCUMENTS

| | | | | |
|---|---|---|---|---|
| CN | 103773181 | | 5/2014 | |
| CN | 103722832 | | 12/2015 | |
| EP | 0354131 | A2 * | 2/1990 | ............... H01F 1/11 |
| EP | 785557 | | 7/1997 | |
| JP | H07-183110 | | 7/1995 | |
| JP | H07-183110 | A * | 7/1995 | ............... H01F 1/00 |
| JP | 2001284877 | | 10/2001 | |
| WO | WO-2015157987 | A1 * | 10/2015 | ........... H01L 23/552 |

\* cited by examiner

Adapted from Tong, Advanced Materials and Design for
Electromagnetic Interference Shielding, CRC Press 2009

CONDUCTIVE COMPOSITION FOR LOW FREQUENCY EMI SHIELDING

TECHNICAL FIELD

The present invention relates to a conductive compositions for low frequency EMI shielding. The composition according to the present invention has good electrical and magnetic conductivity and is suitable as a drop-in solution for EMI shielding in a wide frequency range, and especially at low frequency range.

BACKGROUND OF THE INVENTION

The Electromagnetic Interference (EMI) shielding is required for a variety of Radio Frequency (RF) electronics components, primarily used in wireless communication.

The most common EMI shielding solution is using metal lids or cans to cover target areas or components. However, this solution cannot meet the increasing need for miniaturization (thinner and thinner packaging), smaller footprint and higher packing density of electronic components. Therefore, this solution cannot be used in some miniature devices due to the metal cap/lid requiring too much space.

One solution in the industry has been to use conformal shielding technologies, including plating, sputtering and conductive adhesive, in order to mimic above-mentioned metal cans.

One way to provide a metal shield is to form it by plating or sputtering. Sputtering on the package provides a very low UPH (Unit per hour) process. This is due the fact that the process requires vacuuming before sputtering and the metal is deposited at atoms level (takes hours to sputter a layer of several microns thick) and the devices to be sputtered should be well spaced away from each other to ensure good coverage at side walls (the number of devices per sputtering is pretty limited). Plating on the other hand has an issue on side coverage at strip level and is a complicated process. Process requires following steps surface pre-treatment, masking (complicate process, especially for metal lead frame (L/F)), requires large working space and is a wet process with heavy pollution.

In addition, industry typically uses electrically conductive metal fillers including silver, silver coated copper, nickel, gold, etc. in conductive adhesives (in ink, paste or film forms). Use of these fillers is providing an adhesive having very low volume resistivity, close to 1E-05 ohm·cm, and making the adhesives perform well at high frequency >1 GHz EMI shielding and easily obtaining an EMI shielding effectiveness equal or greater than 30 dB. However, the drawback of the current adhesive approach is that it has no EMI shielding effectiveness at relatively low frequency ranges, in particular in the range from 5 MHz to 200 MHz.

In EMI shielding, primary mechanism for high frequency (GHz or higher) EMI shielding is reflection, which is primarily determined by electrical conductivity of shielding layer. While, primary mechanism for low frequency (MHz or lower) EMI shielding is adsorption, which is in turn primarily determined by magnetic permeability of a shielding layer. Therefore, highly electrically conductive adhesive can be applied on top of susceptible device or emitting source to block EMI to or from electronics devices in GHz range. This has been increasingly employed by integrated design and manufactures (IDMs), design houses and subcontractors on wireless communication packages, like Wi-Fi modules, 2G/3G/4G cellular modules, Bluetooth modules etc. Recently, the industry is progressing towards MHz frequency band to enable new wireless communication technologies like Near Field Communication (NFC) and Radio frequency identification (RFID) at 13.56 MHz. For this MHz level EMI shielding, high electrical conductivity alone cannot provide adequate shielding effectiveness.

Therefore, there is a need for a conductive composition, which provide EMI shielding also at low frequency ranges, while maintaining good EMI shielding at higher frequency ranges, and at the same time can be applied in miniature devices.

SUMMARY OF THE INVENTION

The present invention relates to an EMI shielding composition comprising a resin comprising a thermoplastic resin and/or a thermoset resin, a solvent and/or a reactive diluent and particles comprising a mixture of magnetic particles and electrically conductive particles or magnetic particles coated with an electrically conductive material or a mixture of electrically conductive particles and magnetic particles coated with an electrically conductive material, wherein said composition comprises 10% magnetic particles by weight, by total weight of the composition.

In addition, the present invention relates to use of a conductive composition according to the present invention as EMI shielding material.

Furthermore, the present invention also encompasses a cured product of an EMI shielding composition according to the present invention.

DETAILED DESCRIPTION OF THE INVENTION

In the following passages the present invention is described in more detail. Each aspect so described may be combined with any other aspect or aspects unless clearly indicated to the contrary. In particular, any feature indicated as being preferred or advantageous may be combined with any other feature or features indicated as being preferred or advantageous.

In the context of the present invention, the terms used are to be construed in accordance with the following definitions, unless a context dictates otherwise.

As used herein, the singular forms "a", "an" and "the" include both singular and plural referents unless the context clearly dictates otherwise.

The terms "comprising", "comprises" and "comprised of" as used herein are synonymous with "including", "includes" or "containing", "contains", and are inclusive or open-ended and do not exclude additional, non-recited members, elements or method steps.

The recitation of numerical end points includes all numbers and fractions subsumed within the respective ranges, as well as the recited end points.

When an amount, a concentration or other values or parameters is/are expressed in form of a range, a preferable range, or a preferable upper limit value and a preferable lower limit value, it should be understood as that any ranges obtained by combining any upper limit or preferable value with any lower limit or preferable value are specifically disclosed, without considering whether the obtained ranges are clearly mentioned in the context.

Unless otherwise defined, all terms used in the disclosing the invention, including technical and scientific terms, have the meaning as commonly understood by one of the ordinary skill in the art to which this invention belongs to. By means of further guidance, term definitions are included to better appreciate the teaching of the present invention.

The present invention provides an EMI shielding composition comprising a resin comprising a thermoplastic resin and/or a thermoset resin, a solvent and/or a reactive diluent and particles comprising a mixture of magnetic particles and electrically conductive particles or magnetic particles coated with an electrically conductive material or a mixture of electrically conductive particles and magnetic particles coated with an electrically conductive material, wherein said composition comprises ≥10% magnetic particles by weight, by total weight of the composition.

The applicant has found out that by incorporating both magnetic fillers and electrically conductive fillers into an adhesive composition, providing magnetic permeability and high electrical conductivity lead to a desired EMI shielding effectiveness at both high and low frequency ranges.

Each of the essential components of the EMI shielding composition according to the present invention are described in details below.

An EMI shielding composition according to the present invention comprises a resin comprising a thermoplastic resin or a thermoset resin or a mixture of a thermoplastic resin and a thermoset resin.

Thermoplastic Resin

An EMI shielding composition according to the present invention comprises a thermoplastic resin. A wide variety of known thermoplastic resins can be used in the present invention. The thermoplastic resin may be any thermoplastic resin.

Suitable thermoplastic resins for use in the present invention are selected from the group consisting of phenoxy resin, polyurethane resin, polyester resin, polyether resin, polysulphone resin, polyvinyl resin, polyvinylidene resin, polystyrene resin, polystyrene copolymer resin, fluoro resin, poly(meth)acrylate resin, polyamide resin, polyimide resin, cellulose resin, polyolefin resin, polycarbonate resin and mixtures thereof. Preferably, thermoplastic resin is selected from the group consisting phenoxy resin, polyurethane resin, polyester resin, poly(meth)acrylate resin and mixtures thereof.

More preferably said thermoplastic resin is selected from the group consisting of poly methyl methacrylate resin, co-polymer of bisphenol A and epichlorohydrin, saturated polyester resin, unsaturated polyester resin, saturated polyether resin, unsaturated polyether resin, aromatic polyurethane resin, polytetrafluoroethylene resin, co-polymer of styrene and butadiene, polyvinylidene fluoride resin, polyvinylchloride resin and mixtures thereof.

Suitable thermoplastic resins to be used in the present invention have a molecular weight Mw greater than 10000, preferably having $M_w$ (average) from 30000 to 60000 and $M_n$ (average) from 10000 to 20000. Molecular weight is determined by using gel permeation chromatography (GPC).

Suitable commercially available thermoplastic resins for use in the present invention are for example phenoxy resins, from InChemRez, Estane TPU from Lubrizol, Epicon from DIC and Vitel polyesters from Bostik.

Thermoset Resin

An EMI shielding composition according to the present invention comprises a thermoset resin. A wide variety of known thermoset resins can be used in the present invention.

Exemplary suitable thermoset resins to be used herein the present invention include allyl resin, vinyl resin, acrylic resin, phenolic resin, epoxy resin, oxetane resin, isocyanate resin, maleimide resin, bismaleimide resin, cyanate ester resin, and silicon-containing resin, cyanoacrylate resin, vinyl ester resin and mixtures thereof, preferably, thermoset resin is selected from epoxy resin, acrylic resin, silicon-containing resin and mixtures thereof.

Preferably, thermoset resin is selected from the group consisting of polyurethane acrylate, polyacrylate, epichlorohydrin-phenol formaldehyde resin, liquid bis-maleimide resin, N-phenyl maleimide resin, organo-silicone resin, polymethyl silicone resin, polyethyl silicone resin, polyaryl silicone resin, polyalkylaryl silicone resin, bisphenol epoxy resin, biphenyl epoxy resin, siloxane epoxy resin, toluene diisocyanate resin, methylenediphenyl diisocyanate resin and mixtures thereof.

Suitable thermoset resin may be a multifunctional resin with a mixture of functional groups such as epoxide resins having other functional group(s) selected from allyl glycidyl ether, glycidyl methacrylate, glycidyl acrylate and 1-vinyl-3,4-epoxycyclohexane.

Suitable commercially available thermoset resins for use in the present invention are for example Epiclon N-730 from DIC, UN9200A from Sartomer, CM 1003 from Henkel, VQM 803 from Evonik.

Suitable thermoset resin for use in the present invention have a molecular weight Mw greater than 1000. Molecular weight is determined by using gel permeation chromatography (GPC).

An EMI shielding composition according to the present invention comprises a resin from 2 to 60% by weight of total weight of the composition, preferably from 4 to 45% and more preferably from 4 to 30% and most preferably from 4 to 20%.

It is preferred that the total amount of the thermoplastic resin and thermoset resin in the EMI shielding composition does not exceed 60% by weight of total weight of the composition. Too high resin quantity in the composition leads to a poor electrical conductivity and magnetic permeability, and as a result, poor EMI shielding properties. On the other hand, if the total amount of resin is less than 2% by weight of total weight of the composition, the adhesion properties may be negatively affected.

An EMI shielding composition according to the present invention comprises particles. In one embodiment particles comprise a mixture of magnetic particles and electrically conductive particles. In another embodiment particles comprise a magnetic particles coated with an electrically conductive material. Yet in another embodiment, particles comprise a mixture of electrically conductive particles and magnetic particles coated with an electrically conductive material.

Magnetic Particles

An EMI shielding composition according to the present invention comprises magnetic particles. Suitable magnetic particles are for example ferromagnetic particles and nanocrystalline ferromagnetic particles.

More specifically, suitable magnetic particles for use in the present invention are selected from the group consisting of nickel, iron, cobalt, ferrites, iron-nickel alloys, permalloy, silicon iron (FeSi), FeSiCr alloys, FeSiAl alloys, FeCo alloys and mixtures thereof.

Suitable magnetic particles coated with an electrically conductive material for use in the present invention are selected from the group consisting of silver coated nickel, silver coated iron, silver coated cobalt, silver coated iron-nickel alloys, silver coated permalloy, silver coated ferrites, silver coated silicon iron, silver coated FeSiCr alloys, silver coated FeSiAl alloys, silver coated FeCO alloys and mixtures thereof.

Preferably magnetic particles are selected from the group consisting of ferrites, iron-nickel alloys, iron, nickel, FeSiAl alloys, FeSiCr alloys, silver coated nickel, silver coated iron, silver coated iron-nickel alloys and mixtures thereof.

Suitable commercially available magnetic particles for use in the present invention are for example Nickel type 255 from INCO, silver coated nickel AO-QCS-78 from DOWA and FeNi alloys, FeSiAl from Carpenter Powder Products and Ferrites from PPTechnologies.

Magnetic particles, can be in a powder form or in a flake form or mixture of these two. Preferably, magnetic particles are a mixture of particles in powder form and in flake form. Suitable magnetic particles used in the present invention have a particle size preferably greater than 10 nm and they have a mean average particle size less than 75 µm, preferably less than 50 µm.

In general, too big particle size leads to uneven surface of the EMI shielding layer and there also may be some small voids or holes in the EMI shielding layer, and therefore, EMI shielding coverage is not full. Whereas, too small particle size leads potential risk of low conductivity and poor formulation rheology.

An EMI shielding composition according to the present invention comprises 10% magnetic particles by weight, by total weight of the composition. Equal or greater quantity than 10% is required to provide adequate magnetic properties in order to provide an EMI shielding at low frequency ranges.

An EMI shielding composition according to the present invention comprises magnetic particles from 10 to 95% by weight of total weight of the composition, preferably from 20 to 90%, more preferably from 30 to 85% and more preferably from 40 to 85%.

If the quantity of magnetic particles exceeds 95%, the composition does not provide adequate adhesion. On the other hand, quantity below 10% does not to provide adequate magnetic properties in order to provide an EMI shielding at low frequency ranges.

Electrically Conductive Particles

An EMI shielding composition according to the present invention comprises electrically conductive particles. Suitable electrically conductive particles for use in the present invention are selected from the group consisting of silver particles, copper particles, zinc particles, tin particles, bismuth particles, antimony particles, indium particles, aluminium particles; gold particles, graphite particles, carbon particles, silver coated copper particles, silver coated glass particles, silver coated aluminium particles, silver coated tin particles, silver coated bismuth particles, silver coated antimony particles, silver coated indium particles, silver coated zinc particles, silver coated graphite, alloy particles made of two or more mixtures from tin, silver, bismuth, antimony, zinc, copper and indium; silver coated alloy particles made of two or more metals selected from tin, silver, bismuth, antimony, zinc, copper and indium; and mixtures thereof, preferably, the electrically conductive particles are silver particles.

Suitable commercially available electrically conductive particles for use in the present invention are low tap density (tap density in the range of 0.1 to 3.5 g/cm$^3$) silver powders and flakes from Metalor or other Silver particle manufactures such as Ames Goldsmith.

Electrically conductive particles, can be in a powder form or in a flake form or mixture of these two. Preferably, electrically conductive particles are a mixture of particles in powder form and in flake form.

Suitable electrically conductive particles used in the present invention have a particle size preferably greater than 10 nm and they have a mean average particle size less than 75 µm, preferably less than 50 µm.

In general, too big particle size leads to uneven surface of the EMI shielding layer and there also may be some small voids or holes in the EMI shielding layer, and therefore, EMI shielding coverage is not full. Whereas, too small particle size leads potential risk of low conductivity and high viscosity.

An EMI shielding composition according to present invention comprises electrically conductive particles from 5 to 85% by weight of total weight of the composition, preferably from 10 to 80%, and more preferably from 10 to 73%.

If the quantity of electrically conductive particles exceeds 85%, the composition does not provide adequate adhesion, and in addition it is difficult to form a film from the composition. On the other hand if the quantity is below 5%, the composition does not have adequate conductivity.

An EMI shielding composition according to the present invention comprises a solvent or reactive diluent or mixture of a solvent and a reactive diluent.

Solvent

An EMI shielding composition according to the present invention comprises a solvent. A solvent is particularly preferred when a thermoplastic resin is used.

Suitable solvents for use in the present invention are selected from the group consisting of water, methanol, ethanol, propanol, butanol, ethylene glycol, propyl acetate, butyl acetate, dibasic ester, ethyl proxitol ethoxypropanol, carbitol acetate, 2-methoxy-1-methyethyl acetate, carbitol acetate, 2-methoxy-1-methylethyl acetate, dipropylene glycol methyl ether, ethylene glycol monobutyl ether acetate, methyl isobutyl ketone, 2-buthoxy ethanol, diethylene glycol monobutyl ether acetate, 4-methyl-1,3-dioxolane-2-one, dimethyl sulfoxide, N-methyl-2-pyroridone, diethylene glycol monobutyl ether, triethyleneglycol monomethylether, diethyleneglycol ethyl ether acetate, diethylene glycol monoethyl ether, diethylene glycol monomethyl ether, phenol, terpineol, γ-butyro lactone, ester mixture containing methyl succinate and glutaric acid methyl and dimethyl adipate, butyl glycol acetate and mixtures thereof. Preferably said solvent is selected from the group consisting of 2-methoxy-1-methyethyl acetate, butyl glycol acetate, carbitol acetate, dibasic ester and mixtures thereof.

Suitable commercially available solvents for use in the present invention are for example 2-methoxy-1-methyl ethyl acetate and dibasic ester from Sigma Aldrich; and butyl glycol acetate and carbitol acetate from EASTMAN.

An EMI shielding composition according to the present invention comprises a solvent from 5 to 70% by weight of total weight of the composition, preferably from 15 to 50%, more preferably from 15 to 45%.

It is preferred that the total quantity of the solvent in the EMI shielding composition according to the present invention does not exceed 70% by weight of total weight of the composition. High solvent quantity in the composition leads to a poor electrical conductivity, poor magnetic properties and poor adhesion. In addition, too high solvent quantity leads low dry film thickness and that will cause poor shielding performance. On the other hand, low solvent quantity leads to high viscosity and poor electrical conductivity and poor magnetic properties.

Reactive Diluent

An EMI shielding composition according to the present invention comprises a reactive diluent. Reactive diluent is particularly preferred when thermoset resins are used as a resin. Suitable reactive diluents for use in the present invention are selected from the group consisting of 3,4-epoxycyclohexanecarboxylate, isobornyl acrylate, 2-phenoxyethyl acrylate; neodecanic acid-2,3-epoxypropyl ester; 1,4-butanedioldiglycidyl ether; C8-C10 alkyl glycidyl ethers selected from n-butylglycidyl ether and 2-ethylhexyl glycidyl ether; aromatic glycidyl ethers selected from phenyl gylcidyl ether, cresyl glycidyl ether and p-s-butylphenyl glycidyl ether, tetraglycidylbis-(p-aminophenyl)-methane; styrene oxide and α-pinene oxide; monoepoxide compounds having other functional group(s) selected from allyl glycidyl ether, glycidyl methacrylate, glycidyl acrylate and 1-vinyl-3,4-epoxycyclohexane; a diepoxide compound selected from (poly)ethylene glycol diglycidyl ether, (poly)propylene glycol diglycidyl ether, butanediol diglycidyl ether and neopentyl glycol diglycidyl ether; and a triepoxide compound selected from trimethylolpropane triglycidyl ether and glycerin triglycidyl ether; and mixtures thereof, preferably reactive diluent is selected from the group consisting of 3,4-epoxycyclohexanecarboxylate, isobornyl acrylate, 2-phenoxy ethyl acrylate and mixtures thereof.

Suitable commercially available reactive diluents for use in the present invention are for example RE1825 from DAICEL and Isobornyl acrylate such as SR506 from Sartomer.

An EMI shielding composition according to the present invention comprises a reactive diluent from 3 to 30% by weight of total weight of the composition, preferably from 5 to 20%, more preferably from 5 to 15%.

It is preferred that the total quantity of the reactive diluent in the EMI shielding composition according to the present invention does not exceed 30% by weight of total weight of the composition. Too high reactive diluent quantity in the composition leads to a poor electrical conductivity, poor magnetic properties and poor adhesion. On the other hand low reactive diluent quantity leads to high viscosity and poor electrical conductivity and poor magnetic properties.

Curing Agent

An EMI shielding composition according to the present invention may further comprise a curing agent. A curing agent is especially preferred when EMI shielding composition comprises a thermoset resin.

Suitable curing agents to be used herein the present invention include anhydride-containing compounds; nitrogen-containing compounds such as amine compounds, amide compounds and imidazole compounds; polyfunctional phenols; carboxylic acids; thiols; polyols; polyamides; peroxides; hydrogen silicones; and platinum catalysts and mixtures thereof. More particularly, the composition may be cured using stoichiometric amounts of a curing agent, such as anhydrides, primary and secondary amines, polyfunctional phenols, carboxylic acids, thiols and polyols; the composition may be cured using non-stoichiometric amounts of catalysts, such as tertiary amines, imidazoles and peroxides; or the composition may be cured through a combination of such curing agents and catalysts.

Preferably said curing agent is selected from the group consisting of 1-cyanoethyl-2-ethyl-4-methylimidazole, blocked amines, modified imidazoles, dodecenyl succinic anhydride, peroxides and mixtures thereof.

Suitable commercially available curing agents for use in the present invention are for example Imicure HAPI from Airproducts, EMI-24-CN from PCI Synthesis, EH 2021 from Adeka and DiCup from AkzoNobel.

An EMI shielding composition according to the present invention may comprise a curing agent from 0.1 to 20% by weight of the total weight of the composition, preferably from 0.2 to 10%, more preferably from 0.5 to 5%, and even more preferably from 0.75 to 2.5%.

Cross-Linking Agent

An EMI shielding composition according to the present invention may further comprise a cross-linking agent. A cross linking agent is particularly preferred when said EMI shielding composition comprises a silicone based resin. Suitable cross linking agents for use in the present invention include silicones hydrogen-containing silicones, saline coupling agents, silicic acid, platinum catalyst and mixtures thereof.

Suitable commercially available cross-linking agents for use in the present invention are for example Silopren U cross linking agent 430 from Momentive.

An EMI shielding composition according to the present invention may comprise a cross linking agent from 0.01 to 10% by weight of total weight of the composition, preferably from 0.5 to 5% and more preferably from 1.5 to 3% and most preferably from 1.75 to 2.75%.

Photoinitiator

An EMI shielding composition according to the present invention may further comprise a photoinitiator. A photoinitiator is particularly preferred, when the EMI shielding composition comprises silicone resin.

Suitable photoinitiators to be used herein the present invention are for example hydroxyketones, aminoketones, monoacylphosphinoxides, bisacylphosphinoxides, antimoniates, organic peroxides, azo-initiators and mixtures thereof. More particularly a photoinitiator may be bis(2,4,6-trimethylbenzoyl)-phenylphosphineoxide.

Suitable commercially available photoinitiators for use in the present invention are for example Irgacure 819 from BASF.

An EMI shielding composition according to the present invention may comprise a photoinitiator from 0.01 to 2.5% by weight of total weight of the composition, preferably from 0.1 to 2% and more preferably from 0.2 to 2%.

Adhesion Promoter

An EMI shielding composition according to the present invention may further comprise an adhesion promoter. Suitable adhesion promoters to be used herein the present invention include silanes.

Preferably adhesion promoter is selected from the group consisting of (3-glycidyloxypropyl)-trimethoxysilane, γ-methacryloxypropyltrimethoxysilane, bis[3-(triethoxysilyl)-propyl]-tetrasulfide and mixtures thereof.

Suitable commercially available adhesion promoters for use in the present invention are for example Z6040 and Z6030 from Dow Corning; and TS4 from UCT United chemical Technologies.

An EMI shielding composition according to the present invention may comprise an adhesion promoter from 0.05 to 2% by weight of the total weight of the composition, preferably from 0.1 to 1%.

Rheology Modifier

An EMI shielding composition according to the present invention may further comprise a rheology modifier. Suitable rheology modifiers to be used herein the present invention include silicones and siloxanes such as dimethyl silicone polymer with silica and fumed silica.

Suitable commercially available rheology modifiers for use in the present invention is for example Cab-O-Sil TS-720 from Cabot Corporation.

An EMI shielding composition according to the present invention may comprise a rheology modifier from 0.01 to 10% by weight of total weight of the composition, preferably from 0.5 to 5% and more preferably from 1.5 to 3% and most preferably from 1.75 to 2.75%.

Wetting and Dispersing Agent

An EMI shielding composition according to the present invention may further comprise a wetting and dispersing agent. A wetting and dispersing agent is used to reduce viscosity of the composition and to improve filler dispersity.

Suitable wetting and dispersing agents for use in the present invention are for example acidic polyesters and hydroxy-functional alkylammonium salt of an acidic copolymer.

Suitable commercially available wetting and dispersing agents for use in the present invention are for example BYK-W985 and BYK W-969 from Altana.

An EMI shielding composition according to the present invention may comprise wetting and dispersing agent from 0.01 to 5% by weight of total weight of the composition, preferably from 0.1 to 3% and more preferably from 0.2 to 2%.

In addition, the EMI shielding composition according to the present invention may further comprise optional ingredients such as surface gloss promoter, conductivity promoter, anti-bleeding agent and corrosion inhibitor.

The EMI shielding composition according to the present invention may be in a form of a paste, a liquid or a film.

The Emi shielding composition according to the present invention is suitable as a drop-in solution for EMI shielding in a wide frequency range from 1 MHz to 5 GHz, providing especially effective EMI shielding at relatively low frequency range from 5 MHz to 200 MHz.

An EMI shielding composition according to the present invention can be used as an EMI shielding material in electrical devices. EMI shielding composition according to the present invention can be used for EMI shielding for example in semiconductor package like SIP, radio frequency device, embedded multimedia device or board level package that can replace current metal cap/lid. These packages can be used for example in mobile devices, wearables, computers, cars and medical instruments.

The present invention uses the EMI shielding composition on top of and/or inside the package. The EMI shielding composition according to the present invention can be applied for example by spray coating, by dispensing or jetting or printing. The spray coating can be air spray coating and electrostatic spray coating. The EMI shielding composition according to the present invention has slightly different physical properties depending on the application method.

Spray coating type EMI shielding composition according to the present invention has a viscosity at 5 rpm from 100 to 30000 cps, preferably from 300 to 5000 cps, more preferably from 500 to 3250 cps, wherein viscosity is measured according to method described below.

Viscosity is measured by using standard testing method for Brookfield HBDV-III ULTRA with CPE-51 for Electronic Gap Setting Model, therefore, viscosity is measured by using Brookfield HBDV-III ULTRA with CPE-51 for Electronic Gap Setting Model. Testing temperature is set at 25° C.±0.1° C. and kept constant. Testing data is measured at 0.5 rpm and 5 rpm separately.

Thixotrophy index (TI) value is calculated from the ratio of data at 0.5 rpm by that at 5 rpm (viscosity at 0.5 rpm/viscosity at 5 rpm).

Spray coating type EMI shielding composition according to the present invention has a thixotropic index greater than 1, preferably from 2 to 8.

Spray coating type EMI shielding composition according to the present invention has a yield stress greater than 1, preferably from 2.5 to 8, wherein yield stress is measured according to test method disclosed below Yield stress is measured by using standard testing method for Rheometer AR2000, and therefore, yield stress is measured by using Rheometer AR 2000, from TA Instruments. Casson mode is used to calculate the yield stress.

Dispensing/jetting coating type EMI shielding according to the present invention has a viscosity at 5 rpm from 100 to 300000 cps, preferably from 1000 to 30000 cps, more preferably from 3000 to 15000 cps, wherein viscosity is measured according to test method described above.

Dispensing/jetting coating type EMI shielding composition according to the present invention has a thixotropic index (viscosity at 0.5 rpm/viscosity at 5 rpm) greater than 0, but less than 5, preferably less than 2.5.

Dispensing/jetting coating type EMI shielding composition according to the present invention has a yield stress is greater than 0, but less than 30, preferably less than 10, wherein yield stress is measured according to method described above.

The present invention is also directed to a cured product of an EMI shielding composition according to the present invention.

EMI shielding composition according to the present invention provides considerable electrical and magnetic conductivity after full cure. Preferably volume resistivity of the cured EMI shielding composition according to the present invention is <5E-02 ohm·cm. Preferably relative magnetic permeability of the cured EMI shielding composition according to the present invention is greater than 1.1. The test methods for volume resistivity and relative magnetic permeability are described in detail in the examples section below.

EMI shielding composition according to the present invention provides shielding effectiveness equal or greater than 20 dB, preferably equal or greater than 30 and more preferably equal or greater than 40 dB, wherein the shielding effectiveness is measured according to test method described in the experimental section below.

EXAMPLES

Volume Resistance

Figure 1:
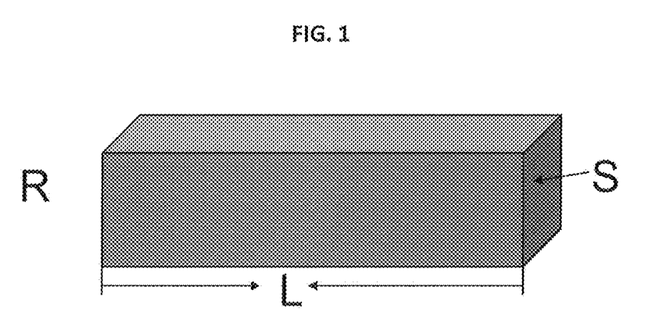
FIG. 1 shows an exemplified shape for defining the term "Volume Resistance".

FIG. 1 shows an exemplified shape for defining the term "Volume Resistance".

for: $R = \rho L/S$ [$\Omega$, ohm]

$\rho$: at 25° C. the (volume) resistivity of conductor with 1 m length and 1 mm$^2$ cross section area Volume Resistance: $\rho = RS/L$ [$\mu\Omega \cdot m$, $\mu ohm \cdot m$, 10E-4 ohm-cm]

Agilent 34401A digital multimeter, Gen Rad 1689 Precision RLC Digibridge was used in the measurements.

A special four-point probe test fixture was made from an acrylic material with four spring-loaded contacts. The contacts were set into the acrylic in order that the current contacts were two inches (5.08 cm) apart, the voltage contacts were between the two current contacts, and the voltage contacts were separated from each current contact by 0.5 inch (1.27 cm).

Sample Preparation:

Two rolls of 3M Magic Scotch Tape were loaded into the jig, 0.1" (0.254 cm) apart.

A cleaned glass slide having two parallel strips of Scotch tape that were 0.1" (0.254 cm) apart was slid along the flat bar of the jig. No wrinkles or bubbles were trapped in the tape. NOTE: The glass plate was cleaned with alcohol or acetone and air dried before the use.

The taped glass plate was placed onto a sheet of laboratory paper towel (taped side facing up) and a dab of the adhesive was dropped onto the glass plate between the two tape strips.

The straight edge of another glass plate (or a single edge razor blade) was used to squeeze the adhesive between the two strips of the tape from one end of the glass slide to the other end (glass plate was maintained in about a 30° angle between the surface of the glass plate and the straight edge,). The adhesive was firmly squeezed, but not an excessive force was not used. The length of the applied strip was at least 2.5 in (6.35 cm).

The two strips of the tape were removed from the glass slide and the sample was cured in a preheated oven according to the specified cure schedule.

The specimens were removed from the oven (or hot plate) and cooled to the room temperature and measured.

Relative Magnetic Permeability

Sample Preparation:

A pressurized mould (2 mm*2 mm*0.3 mm thickness) was sprayed with some release agent. A flat, cylindrical specimen was prepared by squeezing or pouring the adhesive paste into the mould. The specimen was cured in a preheated oven (under pressure to eliminate voids) according to the specified cure schedule provided. Note: It may be necessary to cure the specimen for an extended 1 hour. The additional 1 hour would allow the mould enough time to be heated up to the specified temperature. This would ensure the specimen is fully cured.

Test Equipment: PPMS (Physical Property Measurement System) from Quantum Design. Sample size: 2.5 mm*2.5 mm*0.3 mm. Input: magnetic field strength H. Response magnetic torque M. Output: After a linear fitting (before saturation) the slope is the permeability.

Figure 2:
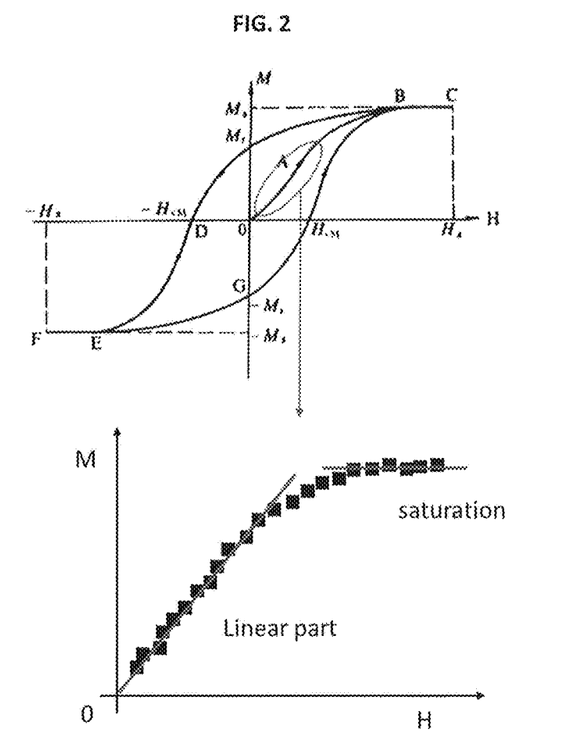
FIG. 2 shows a graph of response magnetic torque M vs. magnetic field strength H of an example of the present invention.

FIG. 2 shows a graph of response magnetic torque M vs. magnetic field strength H of an example of the present invention. The applied magnetic field H varied from 0 Oe to 30000 Oe with a rate 100 Oe/s, but the M reached saturation value for most samples after 10000 Oe, which means the linear part was from 0 Oe to 10000 Oe.

The Shielding Effectiveness

The film having a thickness from 3 to 150 μm is prepared from the composition according to the present invention. The thickness of the film varies depending on application, but is simulating the actual thickness in the target application.

Figure 3:
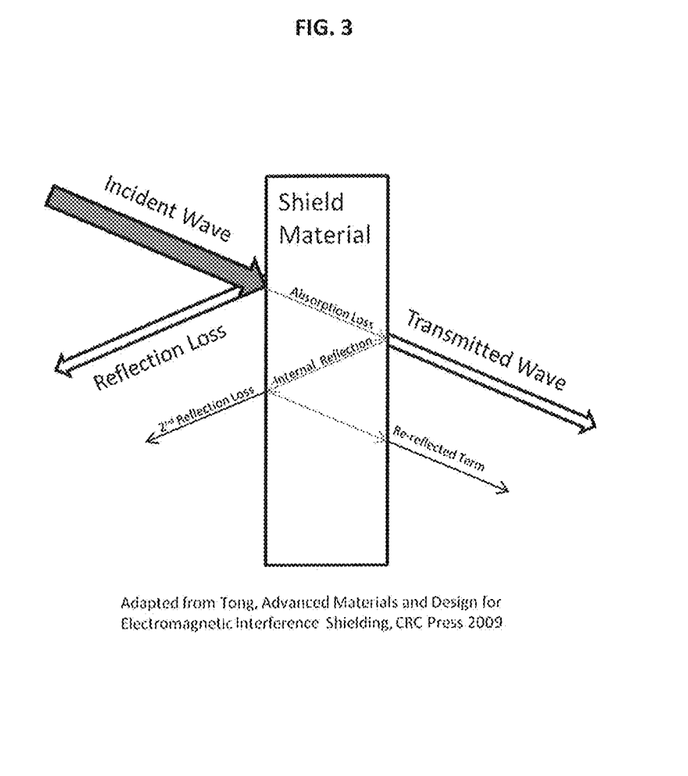
FIG. 3 schematically shows a shielding effect of a shield material of an example of the present invention.

FIG. 3 schematically shows a shielding effect of a shield material of an example of the present invention. The shielding effect is done through placing the shield material between EMI wave source and EMI wave detector. The shielding effectiveness is defined as the log of the ratio of transmitted EM wave and incident EM wave.

Shielding effectiveness is calculated from the following equation: $SE\ (dB) = 10 \times \log(E_i/E_t)$, in which $E_i$ stands for incident energy and $E_t$ stands for transmitted energy. The factor in the equation may be 10 or 20 depending if the ratio is energy or voltage, if the energy of the EM wave is measured, then factor 20 is used and on the other hand, the voltage used to generate the EM wave is measured, then the factor is 10.

The following examples were prepared by following method:

All materials except particles were added into one container. The mixture were mixed by hand and followed by 3 roll mill in order to mix well the particles into the resin system. Magnetic and electrically conductive particle were added into the mixture and hand mixed and followed by mixing by Thinky mixer (with revolution and rotation mix) by 1000 rpm for 1 min with degassing.

TABLE 1

Comparative example

| Ingredient | Comparative example |
|---|---|
| Epoxy Resin Epiclon 830S from DIC | 7 |
| Epoxy Resin RE1825 from DAICEL | 10 |
| Curing Agent HAPI from Airproduct | 1 |
| Silver C-2462P from Metalor | 16 |
| Silver coated copper AgCu0204 from Ames Advanced Materials corporation | 66 |
|  | 100 |

| Properties | |
|---|---|
| Volume Resistance (ohm · cm) | 6 * 10−5 |
| Relative Magnetic permeability | 0.99 |

TABLE 2

| Ingredient | Ex. 1 | Ex. 2 | Ex. 3 | Ex. 4 | Ex. 5 | Ex. 6 | Ex. 7 | Ex. 8 | Ex. 9 | Ex. 10 | Ex. 11 |
|---|---|---|---|---|---|---|---|---|---|---|---|
| Epoxy Resin Epiclon 830S from DIC | 7 | 1 | 7 | 7 | 7 | 7 | 7 | 7 | 7 | | |
| Epoxy Resin RE1825 from DAICEL reactive diluent | 10 | 10 | 10 | 10 | 10 | 10 | 10 | 10 | 10 | | |
| Acrylate SR506 from Sartomer reactive diluent | | | | | | | | | | 5 | |
| BMI resin from Henkel | | | | | | | | | | 10 | |
| Silicone resin VQM803 from Evonik | | | | | | | | | | | 6.5 |
| Silicone resin VQM885 from Evonik | | | | | | | | | | | 6.5 |
| Curing Agent HAPI from Air product | 1 | 1 | 1 | 1 | 1 | 1 | 1 | 1 | 1 | 0.5 | |
| Hydogene silicone Silopren U crosslinking agent 430 from Momentive | | | | | | | | | | | 2 |
| Photoinitiator Irgacure 819 from BASF | | | | | | | | | | | 0.5 |
| Silver C-2462P from Metalor | 72 | 62 | 52 | 41 | 41 | 30 | 30 | 20 | 32 | 54.5 | 54.5 |

TABLE 2-continued

| Ingredient | | | | | | | | | |
|---|---|---|---|---|---|---|---|---|---|
| Nickel Type 255 from INCO | 10 | 20 | 30 | 41 | | | | 30 | 30 |
| Silver coated nickel AO-QCS-78 from DOWA | | | | | 41 | 52 | | | |
| Silver coated iron 6672-2 from Technic | | | | | | | 52 | 62 | |
| Silver coated Fe—Ni alloy P733-2 from Metalor | | | | | | | | | 50 |

| Ingredient | Ex. 12 | Ex. 13 | Ex. 14 | Ex. 15 | Ex. 16 | Ex. 17 | Ex. 18 |
|---|---|---|---|---|---|---|---|
| Phenoxy Resin from InChemRez | 4.5 | 4.5 | 4.5 | 4.5 | 4.5 | 4.5 | |
| Estane PU resin | | | | | | | 4.5 |
| Solvent 2-methoxy-1-methyethyl acetate from Sigma Aldrich | 16.67 | 16.67 | 16.67 | 16.67 | 16.67 | 16.7 | 18 |
| magnetic filler Permalloy | 70.5 | | | | 62.16 | | |
| magnetic filler Ferrite | | 70.5 | | | | | |
| magnetic filler Iron | | | 70.5 | | | | |
| FeSiAl | | | | | | 70.5 | 68.8 |
| FeSiCr | | | | | | 70.5 | |
| silver Filler KP-84 from Ames Goldsmith | 8.33 | 8.33 | 8.33 | 16.67 | 8.33 | 8.33 | 8.2 |

TABLE 3

| | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|
| Volume resistance (ohm · cm) | $3*10-5$ | $3*10-5$ | $1*10-4$ | $2*10-3$ | $2*10-3$ | $1*10-2$ | $6*10-4$ | $9*10-3$ | $1*10-4$ |
| Relative magnetic permeability | 1.15 | 1.24 | 1.41 | | | | 1.51 | 1.61 | 1.69 |
| Shielding effectiveness dB 10-50M | 10 | 20 | | | | | | 35 | |

TABLE 4

| | Ex. 10 | Ex. 11 | Ex. 12 | Ex. 13 | Ex. 14 | Ex. 15 | Ex. 16 | Ex. 17 | Ex. 18 |
|---|---|---|---|---|---|---|---|---|---|
| Volume resistance (ohm · com) | $1*10-3$ | $6*10-3$ | $3*10-3$ | $6*10-3$ | $3*10-3$ | $5*10-4$ | $5*10-3$ | $6*10-3$ | $9*10-3$ |
| Relative magnetic permeability | 1.4 | 1.35 | 8.5 | 9.7 | 7.5 | | 10 | 7.8 | 9.7 |
| Shielding effectiveness dB 10-50M | | | | | 48 | | 62 | | 50 |

The examples according to the present invention exemplify that magnetic particle type and loading have an effect on relative magnetic permeability, whereas the resin system do not impact a lot on relative magnetic permeability. Ni—Fe Alloy provides highest relative magnetic permeability followed by iron and nickel. Higher silver particle loading provides the electrical conductivity. Furthermore, higher the magnetic loading, higher magnetic permeability. It is preferred to have magnetic filler loading between 60-70% in order to achieve magnetic permeability greater or equal than 4.

The invention claimed is:

1. A cured product of an EMI shielding composition comprising (a) a resin comprising a thermoplastic resin and/or a thermoset resin;
   (b) a solvent and/or a reactive diluent; and
   (c) particles comprising magnetic particles coated with an electrically conductive material or a mixture of electrically conductive particles and magnetic particles coated with an electrically conductive material,
   wherein said composition comprises ≥10% magnetic particles by weight of the total composition, wherein said cured product has a volume resistance less than 5E-02 ohm.cm and relative magnetic permeability greater than 1.1.

2. A cured product of an EMI shielding composition according to claim 1, wherein said magnetic particles are selected from the group consisting of nickel, iron, cobalt, ferrites, permalloy, iron-nickel alloys, silicon iron (FeSi), FeSiCr alloys, FeSiAl alloys, FeCO alloys, silver coated nickel, silver coated iron, silver coated cobalt, silver coated iron-nickel alloys, silver coated permalloy, silver coated ferrites, silver coated silicone iron, silver coated FeSiCr alloys, silver coated FeSiAl alloys, silver coated FeCO alloys and mixtures thereof.

3. A cured product of an EMI shielding composition according to claim 1, wherein said electrically conductive particles are selected from the group consisting of silver particles, copper particles, zinc particles, tin particles, bismuth particles, antimony particles, indium particles, aluminium particles, gold particles; graphite particles, carbon particles, silver coated copper particles, silver coated glass particles, silver coated aluminium particles, silver coated tin particles, silver coated bismuth particles, silver coated antimony particles, silver coated indium particles, silver coated zinc particles, silver coated graphite, alloy particles made of two or more mixtures from tin, silver, bismuth, antimony, zinc, copper and indium; silver coated alloy particles made of two or more metals selected from tin, silver, bismuth, antimony, zinc, copper and indium; and
mixtures thereof.

4. A cured product of an EMI shielding composition according to claim 1, wherein said composition comprises magnetic particles from 10 to 95% by weight of total weight of the composition.

5. A cured product of an EMI shielding composition according to claim 1, wherein said composition comprises electrically conductive particles from 5 to 85% by weight of total weight of the composition.

6. A cured product of an EMI shielding composition according to claim 1, wherein said thermoplastic resin is selected from the group consisting of phenoxy resin, polyurethane resin, polyester resin, polyether resin, polysulphone resin, polyvinyl resin, polyvinylidene resin, polystyrene resin, polystyrene copolymer resin, fluoro resin, poly (meth)acrylate resin, polyamide resin, polyimide resin, cellulose resin, polyolefin resin, polycarbonate resin and mixtures thereof.

7. A cured product of an EMI shielding composition according to claim 1, wherein said thermoset resin is selected from the group consisting of allyl resin, vinyl resin, acrylic resin, phenolic resin, epoxy resin, oxetane resin, isocyanate resin, maleimide resin, bismaleimide resin, cyanate ester resin, and silicon-containing resin, cyanoacrylate resin, vinyl ester resin and mixtures thereof.

8. A cured product of an EMI shielding composition according to claim 1, wherein said composition comprises from 2 to 60% of said resin by weight of total weight of the composition.

9. A cured product of an EMI shielding composition according to claim 1, wherein said solvent is selected from the group consisting of water, methanol, ethanol, propanol, butanol, ethylene glycol, propyl acetate, butyl acetate, dibasic ester, ethyl proxitol ethoxypropanol, carbitol acetate, 2-methoxy-l-methyethyl acetate, carbitol acetate, 2-methoxy-1-methylethyl acetate, dipropylene glycol methyl ether, ethylene glycol monobutyl ether acetate, methyl isobutyl ketone, 2-buthoxy ethanol, diethylene glycol monobutyl ether acetate, 4-methyl-1,3-dioxolane-2-one, dimethyl sulfoxide, N-methyl-2-pyroridone, diethylene glycol monobutyl ether, triethyleneglycol monomethylether, diethyleneglycol ethyl ether acetate, di ethylene glycol monoethyl ether, diethylene glycol monomethyl ether, phenol, terpineol, y-butyro lactone, ester mixture containing methyl succinate and glutaric acid methyl and dimethyl adipate, butyl glycol acetate and mixtures thereof.

10. A cured product of an EMI shielding composition according to claim 1, wherein said composition comprises from 5 to 70% of said solvent by weight of total weight of the composition.

11. A cured product of an EMI shielding composition according to claim 1, wherein said reactive diluent is selected from the group consisting of 3,4-epoxycyclohexanecarboxylate, isobornyl acrylate, 2-phenoxyethyl acrylate; neodecanic acid-2,3-epoxypropy ester; 1,4-butanedioldiglycidyl ether; C8-C10 alkyl glycidyl ethers selected from n-butyglycidyi ether and 2-ethylhexyl glycidyl ether; aromatic glycidyl ethers selected from phenyl gylcidyl ether, cresyl glycidyl ether and p-s-butylphenyl glycidyl ether, tetraglycidylbis-(p-aminophenyl)-methane; styrene oxide and a-pinene oxide; monoepoxide compounds having other functional group(s) selected from allyl glycidyl ether, glycidyl methacrylate, glycidyl acrylate and 1-vinyl-3,4-epoxycyclohexane; a diepoxide compound selected from (poly) ethylene glycoglycol diglycidyl ether, (poly) propylene glycol diglyidyl ether, butanediol diglycidyl ether and neopentyl glycol diglycidyl ether; and a triepoxide compound selected from trimethylolpropane triglycidyl ether and glycerin triglycidyl ether; and mixtures thereof.

12. A cured product of an EMI shielding composition according to claim 1, wherein said composition comprises from 3 to 30% of said reactive diluent by weight of total weight of the composition.

13. A cured product of an EMI shielding composition according to claim 1, wherein said composition comprises a curing agent selected from the group consisting of anhydrides, amine compounds, amide compounds, imidazole compounds, polyfunctional phenols, carboxylic acids, thiols, polyols, polyamides, peroxides, hydrogen silicones and platinum catalysts and mixtures thereof.

14. A cured product of an EMI shielding composition according to claim 13, wherein said composition comprises from 0.1 to 10% of said curing agent by weight of the total weight of the composition.

15. A cured product of an EMI shielding composition according to claim 1, wherein said electrically conductive particles are silver particles.

16. A cured product of an EMI shielding composition according to claim 1, wherein the thermoplastic resin is selected from phenoxy resin, polyurethane resin, polyester resin, poly(meth)acrylate resin and mixtures thereof.

17. A cured product of an EMI shielding composition according to claim 1, wherein the thermoset resin is selected from epoxy resin, acrylic resin, silicon-containing resin and mixtures thereof.

18. A cured product of an EMI shielding composition according to claim 1, wherein the reactive diluent is selected from the group consisting of 3,4-epoxycyclohexanecarboxylate, isobornyl acrylate, 2-phenoxy ethyl acrylate and mixtures thereof.

* * * * *

UNITED STATES PATENT AND TRADEMARK OFFICE
CERTIFICATE OF CORRECTION

Page 1 of 1

PATENT NO. : 10,827,660 B2
APPLICATION NO. : 15/964665
DATED : November 3, 2020
INVENTOR(S) : Chenyu Huang et al.

It is certified that error appears in the above-identified patent and that said Letters Patent is hereby corrected as shown below:

In the Specification

Column 2, Line 22 change "composition comprises 10% magnetic particle by weight" to --composition comprises ≥ 10% magnetic particle by weight--.

Column 5, Line 32 change "invention comprises 10% magnetic particle by weight" to --invention comprises ≥ 10% magnetic particle by weight--.

Column 12, table 2 change "Epoxy Resin Epiclon 830S from DIC 7 1 7" to --Epoxy Resin Epiclon 830S from DIC 7 7 7--.

Signed and Sealed this
Fifteenth Day of June, 2021

Drew Hirshfeld
*Performing the Functions and Duties of the
Under Secretary of Commerce for Intellectual Property and
Director of the United States Patent and Trademark Office*